United States Patent
Murphy et al.

(10) Patent No.: US 7,799,692 B2
(45) Date of Patent: Sep. 21, 2010

(54) METHOD AND APPARATUS FOR THE TREATMENT OF A SEMICONDUCTOR WAFER

(75) Inventors: Brian Murphy, Pfarrkirchen (DE); Diego Feijóo, Burghausen (DE); Reinhold Wahlich, Tittmoning (DE)

(73) Assignee: Siltronic AG, Munich (DE)

( * ) Notice: Subject to any disclaimer, the term of this patent is extended or adjusted under 35 U.S.C. 154(b) by 565 days.

(21) Appl. No.: 11/749,938

(22) Filed: May 17, 2007

(65) Prior Publication Data

US 2007/0267142 A1    Nov. 22, 2007

(30) Foreign Application Priority Data

May 18, 2006    (DE) ................ 10 2006 023 497

(51) Int. Cl.
*H01L 21/302* (2006.01)
*H01L 21/461* (2006.01)

(52) U.S. Cl. ................ 438/705; 216/38; 216/60; 216/85

(58) Field of Classification Search ............ 216/38, 216/60, 85; 438/705, 723, 756
See application file for complete search history.

(56) References Cited

U.S. PATENT DOCUMENTS

| 6,224,934 B1 | 5/2001 | Hasei et al. |
| 2004/0063329 A1 | 4/2004 | Yanagisawa et al. |
| 2006/0097355 A1 | 5/2006 | Bauer et al. |

FOREIGN PATENT DOCUMENTS

| EP | 0488642 A2 | 6/1992 |
| EP | 0511777 A1 | 11/1992 |
| EP | 0798766 A1 | 10/1997 |
| EP | 0690484 B1 | 8/1999 |
| EP | 0961314 | 12/1999 |
| EP | 1100117 A2 | 5/2001 |
| JP | 09-008258 A | 1/1997 |
| JP | 09-232279 A | 9/1997 |

OTHER PUBLICATIONS

Ian W. Boyd et al., "New large area ultraviolet lamp sources and their applications," Nuclear Instruments and Methods in Physics Research B 121 (1997), pp. 349-356.
English Derwent Abstract AN2000-015536 corresponding to EP 961314 A1.

*Primary Examiner*—Roberts Culbert
(74) *Attorney, Agent, or Firm*—Brooks Kushman P.C.

(57) ABSTRACT

Treatment of a semiconductor wafer employs:
a) position-dependent measuring of a parameter characterizing the semiconductor wafer to determine a position-dependent value of the parameter over an entire surface of the semiconductor wafer,
b) oxidizing the entire surface of the semiconductor wafer under the action of an oxidizing agent with simultaneous exposure of the entire surface, the oxidation rate and thus the thickness of the resulting oxide layer dependent on the light intensity at the surface of the semiconductor wafer, and
c) removing of the oxide layer,
the light intensity in step b) predefined in a position-dependent manner such that differences in the position-dependent values of the parameter measured are reduced by the position-dependent oxidation rate resulting in step b) and subsequent removal of the oxide layer in step c).

13 Claims, 2 Drawing Sheets

METHOD AND APPARATUS FOR THE TREATMENT OF A SEMICONDUCTOR WAFER

BACKGROUND OF THE INVENTION

1. Field of the Invention

The present invention relates to a method and an apparatus for the treatment of a semiconductor wafer by means of an oxidation with locally different oxidation rates.

2. Background Art

A semiconductor wafer, in particular a single-crystal silicon wafer for use in the semiconductor industry, has to have a high flatness, in particular in order to take account of the requirements for the production of integrated circuits. A generally recognized rule of thumb states that the $SFQR_{max}$ value of a semiconductor wafer must be no greater than the line width of the components which are intended to be produced on the semiconductor wafer. In order to be able to integrate the maximum possible number of circuits, the required flatness must moreover be ensured as close as possible to the edge of the front side, where the front side is defined as the side on which the components are intended to be produced. This means that the measurement of the flatness is to be carried out with a very small edge exclusion and the specified flatness values need to be satisfied not only for the so-called full sites but also for the partial sites. In this respect, full sites are all surface elements on which complete components can be produced, whereas partial sites are the surface elements at the edge of the wafer on which there is insufficient space for complete components.

In defining the flatness of semiconductor wafers, the SEMI standard M1-94 draws a distinction between global flatness and local flatness. The global flatness relates to the entire wafer surface minus an edge exclusion which is to be defined. It is described by the GBIR ("global backsurface referenced ideal plane/range", or range of the positive and negative deviation from a back surface-referenced ideal plane for the entire front side of the semiconductor wafer), which corresponds to the formerly customary term TTV ("total thickness variation"). The local flatness relates to a limited area on the semiconductor wafer, which generally corresponds to the area of the component to be established thereon. It is often expressed as the SFQR ("site front surface referenced least squares/range", or range of the positive and negative deviation from a front side, defined by error square minimization, for an area of defined dimensions). The variable $SFQR_{max}$ indicates the highest SFQR value for all the component areas on a specific semiconductor wafer. In the case of SFQR, it is always necessary to indicate the area to which the value indicated relates, for example an area of 26×8 mm$^2$ in accordance with the ITRS roadmap.

A further flatness parameter is the so-called nanotopography. This is defined as the peak-to-valley deviation in a predefined surface element, e.g. 2×2 mm$^2$. The nanotopography is measured using measuring units such as ADE CR 83 SQM, ADE PhaseShift Nanomapper or KLA Tencor SNT.

The flatness in the edge region of the semiconductor wafer is crucially influenced by the so-called "Edge Roll off". "A New Method for the Precise Measurement of Wafer Roll off of Silicon Polished Wafer", Jpn. J. Appl. Phys., vol. 38 (1999), pages 38-39, describes the measurement of the "wafer roll off", or edge roll off. The edge roll off can occur both on the front side and on the rear side of the semiconductor wafer. It can have a significant influence on the SFQR values of the surface elements located at the edge of the wafer. An edge roll off is disturbing in particular in the case of semiconductor wafers which, for example to produce SOI wafers, are connected (bonded) to a further semiconductor wafer, since the edge roll off of the wafer surfaces which are to be connected to one another has a great influence on the bonding quality at the edge of the wafer.

At the present time, semiconductor wafers which serve as substrates for the production of microelectronic components are generally produced according to the following conventional process sequence: sawing, lapping and/or grinding, wet-chemical etching, stock removal polishing and mirror polishing. It has been found that this process sequence is unable to ensure the flatnesses required for the ever-decreasing line widths.

In EP798766A1, a vapor phase etching step according to the PACE ("plasma assisted chemical etching") method followed by a heat treatment is inserted between stock removal polishing and mirror polishing in the conventional process sequence, in order to improve the flatness of the semiconductor wafer. It is shown on the basis of the processing of silicon wafers having a diameter of 200 mm that the process sequence described allows GBIR results of 0.2-0.3 μm. The document does not give any local flatness data. Furthermore, it does not state the size of the edge exclusion used for the flatness measurement.

EP961314A1 specifies a similar method, in which, after sawing, grinding, PACE and mirror polishing, GBIR values of at best 0.14 μm and $SFQR_{max}$ values of at best 0.07 μm are achieved.

The PACE method, as proposed in EP961314A1, leads to a deterioration in the roughness of a polished wafer, which can be partially reduced by an additional hydrophobizing step directly before the PACE. PACE has to be carried out in vacuo, which makes the process complex in terms of the equipment technology. Moreover, the semiconductor wafer is contaminated with the decomposition products of the gases used for etching, which necessitates an additional cleaning step, as described in EP1100117A2. Furthermore, this process is not carried out over the entire surface, but rather by scanning the semiconductor wafer. This is on the one hand very time-consuming, and on the other hand leads to problems with regard to the nanotopography in the scanning overlap region and also with regard to flatness ($SFQR_{max}$ and edge roll off) in the outer region of the semiconductor wafer up to a distance of approximately 5 mm from the edge of the wafer. One possible cause is the intensified suction effect at the edge of the semiconductor wafer and therefore reduction of the etching medium, since work is carried out in vacuo. The required overlap during scanning has an adverse effect in particular on the nanotopography at the overlap positions. The larger the diameter of the nozzle which is used to supply the etching medium, the worse the deterioration is. However, for economic reasons the nozzle diameter cannot be chosen to be as small as may be desirable.

Consequently, the methods which are known in the prior art are unable to meet the geometry requirements for components with line widths of less than or equal to 65 nm, that is to say $SFQR_{max}$ values of at most 65 nm. In this context, the most serious problems occur in the edge region of the semiconductor wafer, since the edge exclusion of currently 3 mm (for line widths of 90 nm) is reduced to 2 mm or 1 mm for the future line widths of 65 nm or less, and the partial sites are taken into account when assessing the flatness.

An additional problem arises in the case of so-called SOI wafers. These semiconductor wafers have a semiconductor layer which is situated on a surface of a carrier wafer (base wafer or handle wafer). The thickness of the semiconductor layer varies as a function of the components to be processed.

In general, a distinction is drawn between the so-called "thin layers" (thickness less than 100 nm) and so-called "thick layers" (from 100 nm to approximately 80 µm). The carrier wafer may either be composed entirely of an electrically insulating material (e.g. glass, quartz, sapphire) or may, for example, be composed of a semiconductor material, preferably silicon, and is then merely separated from the semiconductor layer by an electrically insulating layer. The electrically insulating layer may comprise silicon oxide, for example.

SOI wafers are very important for the production of microelectronic components. The semiconductor layer of an SOI wafer has to have a very homogeneous thickness all the way into the outermost edge region. In particular in the case of semiconductor layers having a thickness of 100 nm or less, the transistor properties, such as e.g. the threshold voltage, vary very considerably in the case of inhomogeneous layer thicknesses. The absolute thickness tolerance for SOI wafers with thin and thick semiconductor layers depends on the layer thickness. The measurement method used to measure the layer thickness is preferably spectroscopic ellipsometry, reflectometry or interferometry.

In order to be able to integrate the maximum possible number of circuits, moreover, the required layer thickness homogeneity has to be ensured as close as possible to the edge of the front side. This in turn means a very small edge exclusion.

Methods for the aftertreatment of an SOI wafer with the aim of improving the layer thickness homogeneity are also known. They are generally local etching methods involving scanning the SOI wafer, a higher etching removal being provided at places where the layer thickness is higher: in accordance with US2004/0063329A1 the surface of the SOI wafer is scanned in a dry etching method by means of a nozzle which is used to locally supply a gaseous etching medium. EP488642A2 and EP511777A1 describe methods in which the semiconductor layer of the SOI wafer is exposed to an etching medium over its entire surface. However, the etching medium is locally activated by a laser beam or a light beam from a light source focused using an optical system, in a manner involving scanning the surface (photochemical etching).

All methods in which the surface of the semiconductor layer has to be scanned in order to achieve a locally different etching removal are very time-intensive and therefore cost-intensive. Moreover, the scanning requires a complex motion on the part of the light source or the nozzle, on the one hand, or the SOI wafer, on the other hand.

Moreover, additional inhomogeneities in the layer thickness occur particularly in the edge region of the wafer, i.e. in a region up to 5 mm away from the edge of the wafer, and in the regions in which the overlap occurs during scanning. Given a layer thickness of 520 nm, according to EP488642A2, a layer thickness homogeneity of 10 nm is achieved, without any details being given as to an edge exclusion. In accordance with EP511777A1, given a layer thickness of 108 nm, a layer thickness homogeneity of 8 nm is achieved, without any details being given as to an edge exclusion. Therefore, despite the complex methods disclosed by the art, the required layer thickness homogeneities are not achieved, in particular in the edge region of the SOI wafer.

SUMMARY OF THE INVENTION

Therefore, an object of the invention is to provide a semiconductor wafer with improved flatness, in particular in the edge region, and also improved nanotopography, which is suitable for the production of components having line widths of 65 nm or less. In this context, the term "semiconductor wafer" also encompasses an SOI wafer. A further object is to provide an SOI wafer with improved layer thickness homogeneity, in particular in the edge region.

These and other objects are achieved by means of a method for the treatment of a semiconductor wafer, comprising the following steps:

a) position-dependent measurement of a parameter which characterizes the semiconductor wafer in order to determine the position-dependent value of the parameter over an entire surface of the semiconductor wafer, b) oxidation of the entire surface of the semiconductor wafer under the action of an oxidizing agent with simultaneous exposure of the entire surface, the oxidation rate and thus the thickness of the resulting oxide layer being dependent on the light intensity at the surface of the semiconductor wafer, and c) removal of the oxide layer, the light intensity in step b) being predefined in a position-dependent manner in such a way that the differences in the position-dependent values of the parameter measured in step a) are reduced by the position-dependent oxidation rate resulting from the position-dependent light intensity in step b) and the subsequent removal of the oxide layer in step c).

DETAILED DESCRIPTION OF THE PREFERRED EMBODIMENT(S)

The subject matter of the invention is thus a method for the treatment of a semiconductor wafer by oxidation of at least one of the surfaces of the semiconductor wafer and removal of the oxide layer. In this method, the surface of the semiconductor wafer (in the case of an SOI wafer, the semiconductor layer), unlike in the prior art, is not treated in punctiform or scanning fashion, but rather is treated over its entire surface. The correction of the parameter measured in a position-dependent manner in step a) is achieved by means of a position-dependent growth rate of the oxide layer (also referred to hereinafter as oxidation rate) in step b). This results in an oxide layer thickness which is different in a position-dependent manner, the oxide layer preferably being subsequently completely removed in step c). By oxidation and removal of the oxide layer, different amounts of material are removed in a position-dependent manner. The locally different oxidation rate required for correction is achieved by means of a locally different light intensity. The local distribution of the light intensity is determined by the local values of the parameter previously measured. The parameter which is intended to be optimized in the method according to the invention is measured in step a). The resultant measured values are used for controlling the local light intensity.

The method according to the invention can be applied to all semiconductor wafers, for example those comprising germanium, preferably comprising silicon-germanium or silicon carbide. Application to silicon is particularly preferred. If the flatness of the front side of a semiconductor wafer of this type is intended to be improved, then the height deviation from a defined ideal plane is suitable as parameter that is measured in step a) of the method, as described above. The height deviation can be determined by means of a conventional geometry measuring unit.

If the global flatness (GBIR) of a semiconductor wafer is intended to be optimized, in step a) the deviation of the wafer front side from an ideal plane defined by the wafer rear side is determined, and in step b) the local light intensity is controlled in such a way that a high oxidation rate is achieved at local elevations and a low oxidation rate is achieved at positions of local depressions.

If, by contrast, the local flatness (SFQR) of a semiconductor wafer is intended to be optimized, in step a) the deviation of the wafer front side from an ideal plane referenced to a specific measurement window, for example of a size of 26×8 mm$^2$, is determined, and in step b) the local light intensity is controlled in such a way that a high oxidation rate is achieved at local elevations and a low oxidation rate is achieved at positions of local depressions.

The method according to the invention can also be applied to SOI wafers, in which case the semiconductor layer of the SOI wafer may comprise germanium, for example. Application to semiconductor layers comprising silicon-germanium or silicon carbide is preferred; application to silicon is particularly preferred. If the layer thickness homogeneity of the semiconductor layer is intended to be improved, then the layer thickness is measured in step a) of the method according to the invention. The thickness of the semiconductor layer can be measured in a position-dependent manner for example by means of an ellipsometer, interferometer or reflectometer. In subsequent step b), the local light intensity is controlled in such a way that a high oxidation rate is achieved at positions having a large layer thickness and a low oxidation rate is achieved at positions having a small layer thickness.

The required material removal is determined for each point on the surface of the semiconductor wafer on the basis of the measurement in step a). Both the required duration of the oxidation treatment and the required light intensity for each point on the surface of the semiconductor wafer can be calculated from the oxidation rate, dependent on the light intensity, which the etching medium used achieves for the relevant semiconductor material and which in turn defines the material removal.

In general, the number and position of measurement points depends on the desired resolution. The maximum number of measurement points possible depends on the size of the measurement probe. By way of example, the size of the measurement probe is 2×2 mm$^2$ in the case of the measuring units ADE 9500 (for semiconductor wafers having a diameter of 200 mm) and ADE AFS (for semiconductor wafers having a diameter of 300 mm).

The required local light intensity is subsequently calculated from the measured values. A suitable method is described below on the basis of geometry data, i.e. for optimizing the GBIR or SFQR, but the method can also be applied in the same manner to nanotopography data or the layer thickness of a semiconductor layer in the case of an SIO wafer.

The geometry measuring unit uses a measurement probe having the size A×A (typically 4×4 mm$^2$ or 2×2 mm$^2$) to provide a complete mapping of the thickness t of the semiconductor wafer having a diameter D. In this case, the thickness t is strictly speaking the height deviation from an ideal plane defined by the rear side of the semiconductor wafer. The data can be transmitted as raw data from the geometry measuring unit to a computer. If a system of Cartesian coordinates is then placed through the center of the semiconductor wafer, a value of the thickness, t(x,y), exists for each point x,y. In this case, x and y are varied in the grid of the measurement window size, which means that t(x,y) is to be understood as the mean of the thickness over the square, defined by x−A/2 to x+A/2 and y−A/2 to y+A/2. The exposure apparatus has a resolution of B×B pixels, for example 1024×1024. The corresponding value from the original thickness matrix is assigned to each matrix element M (a,b) with the aid of a computer-internal matrix having the size B×B:

$$M(a,b)=t(|-D/2+a*D/B|,|-D/2+b*D/B|) \quad (1)$$

in this case, | | symbolizes the absolute magnitude function. The absolute magnitude function can be applied since the resolution of the exposure apparatus is typically greater than that of the original thickness data. If the opposite is the case, only geometric averaging of the original data need be carried out.

Following this transformation, the data are smoothed. The averaging radius R exists as a control parameter. The pixel having the coordinates i,j is assigned the mean from all the pixels which lie in a circle with radius R around the point i,j. A point x,y lies in the circle around i,j precisely when the following condition is met:

$$(i-x)*(i-x)+(j-y)*(j-y) \leq R*R \quad (2)$$

The new value is calculated from the mean of all M(x,y) which meet the above condition:

$$M_{smooth}(i,j)=\text{mean}(M(x_1,y_1), M(x_2,y_2), M(x_3,y_3), \ldots M(x_n,y_n)) \quad (3)$$

Based on the original system of coordinates, R is typically between 0.1 cm and 2 cm and is used as a tuning parameter.

However, in addition to this geometric smoothing, it is also possible to carry out all other standard smoothing methods which are commonly employed in EDP.

The maximum value Max$_M$ and minimum value Min$_M$ of the matrix M$_{smooth}$ allow the generation of the grayscale matrix for the exposure of the semiconductor wafer:

$$\text{Transparent component of the pixel } i,j=(M_{smooth}(i,j)-\text{Min}_M)*(\text{Max}_M-\text{Min}_M)*100\% \quad (4)$$

$$\text{black component of the pixel } i,j=100\%-(M_{smooth}(i,j)-\text{Min}_M)*(\text{Max}_M-\text{Min}_M)*100\% \quad (5)$$

This algorithm represents particularly thick positions of the semiconductor wafer as transparent, so that these positions are exposed with a high light intensity. By contrast, the thinnest positions are represented as black and therefore cannot be exposed or can only be exposed with a low light intensity.

The invention makes use of the dependence of the rate of specific oxidation reactions on the intensity and the wavelength of the light radiated in. This is described in concrete terms below on the basis of the example of silicon. However, the invention can also be applied to other semiconductor materials.

The rate of thermal oxidation of silicon is essentially determined by 1) the formation of reactive oxidizing species, 2) by the diffusion of said species from the wafer surface to the interface between silicon and silicon oxide that is growing into the silicon wafer, and 3) by the formation of silicon oxide at said interface. It is known that one or more of these reaction steps and thus the rate of oxidation reactions can be accelerated by radiating in light having a suitable wavelength.

The influence of the light intensity and wavelength and also the underlying oxidation models were described by Young et al. and Kazor et al. (Young et al., Applied Physic Letters (50(2) (1987), page 80; Kazor et al., Applied Surface Science 54 (1992), pages 460-464).

The oxidizing agent used in step b) is preferably gaseous. A particularly preferred oxidizing agent is oxygen ($O_2$). Nitrogen oxides such as dinitrogen monoxide ($N_2O$) are also suitable. The gas atmosphere may additionally contain further reactive gases such as hydrogen ($H_2$) or chlorine ($Cl_2$) and nonreactive gases such as nitrogen ($N_2$) or noble gases. It may also contain water vapor ($H_2O$); this is referred to in this case as moist oxidation. By way of example the oxidation may also be carried out with air.

If the oxidizing agent is oxygen, then irradiation with UV light having a wavelength of less than 250 nm leads to breaking of the oxygen-oxygen bond, with the result that highly reactive monoatomic oxygen (O) and ozone ($O_3$) arise. This effect increases as the wavelength decreases, so that the use of light having a wavelength of less than 200 nm is preferred if oxygen is used as oxidizing agent. Monoatomic oxygen (O) and ozone ($O_3$) are substantially stronger oxidizing agents than molecular oxygen ($O_2$). Therefore, the oxidation rate can be significantly accelerated by irradiation with UV light in the wavelength range mentioned. This influence was described by Boyd et al. (Boyd et al., Nuclear Instruments and Methods in Physic Research B 121 (1997), pages 349-356).

Ozone and monoatomic oxygen have a very short lifetime, which decreases further as the temperature increases. The oxidation treatment in step b) is preferably carried out at temperatures of 100 to 1100° C. and most preferably at 300 to 500° C. At these temperatures, the lifetime of the reactive oxygen species mentioned is so short that an appreciable diffusion of said species does not occur after they have been produced.

By means of a position-dependent intensity of the UV light, a different quantity of reactive oxygen species can be produced at different positions. Since the diffusion of these species is practically insignificant, a position-dependent, varying concentration of said species and hence a position-dependent oxidation rate are also achieved as a result.

When using light having longer wavelengths, a dependence of the oxidation rate on position can also be achieved as an influence on steps 2) and 3) of the oxidation reaction. However, the greatest effect can be obtained by means of wavelengths below 250 nm and in particular below 200 nm and the influence thereof on step 1) of the oxidation reaction.

The spectral dependence of absorption is important for the selection of a suitable light source for implementing the invention. By way of example, arc lamps are distinguished by a broad spectrum and high intensities, i.e. they can successfully be used for the exposure of entire semiconductor wafers. The appropriate wavelength range can be set by using suitable filters (high-pass, low-pass). In principle, however, it is possible to use all light sources whose light is suitable for obtaining the effects mentioned above. By way of example, low-pressure mercury lamps or sodium vapor lamps, deuterium lamps, excimer lamps, lasers or LEDs are also suitable. If the intention is primarily to influence the creation of reactive oxygen species when using oxygen as oxidizing agent, by means of the position-dependent exposure, (as described above), light sources are preferable which emit a portion of their light below a wavelength of 250 nm or even below 200 nm, for example deuterium lamps, excimer lamps or low-pressure mercury lamps.

There are a number of possibilities for providing an exposure that differs in position-dependent fashion in step b) of the method according to the invention. By way of example, it is possible to use an exposure apparatus having a single light source, the dependence of the exposure on position being achieved by means of filters having position-dependent transmission or mirrors having position-dependent reflectivity. The matrix of the calculated grayscale values can be projected sharply onto the surface of the semiconductor wafer by means of the exposure apparatus with the aid of a suitable optical arrangement and therefore be used for controlling the local light intensity. The optical arrangement is preferably designed in such a way that the surface of the semiconductor wafer which is to be treated is exposed as homogeneously as possible over the entire surface, i.e. preferably with deviations of less than ±10%, if there is no filter having position-dependent transmission or no mirror having position-dependent reflectivity between the light source and the semiconductor wafer. As an alternative, exposure inhomogeneities caused by the light source or the optical arrangement can be taken into account in the algorithm for the calculation of the grayscale values and may be compensated for in this manner.

In one embodiment of the invention, the measurement results for a semiconductor wafer that are obtained in step a) are used to produce a filter which is matched exactly to the individual semiconductor wafer and is then used for the exposure of this one semiconductor wafer. The grayscale values of the filter can be calculated using the algorithm described above. The filter itself can be produced in various ways, for example by producing a filter film using a printing method. The filter is provided for exposure of the semiconductor wafer for which it was produced, in a suitable manner and with correct orientation between light source and semiconductor wafer such that the filter is imaged exactly on the semiconductor wafer.

As an alternative, it is also possible to use an LCD filter in which the transmission can be varied in position-dependent fashion by application of an electrical voltage.

In principle, however, all types of filter are suitable which preferably permit a transmission of approximately 0 to 100% and allow a suitable local resolution. Instead of a filter having locally different light transmissivity, it is also possible to use a correspondingly produced mirror having locally different reflectivity.

A filter or a mirror which can in each case be used for just one semiconductor wafer is very expensive to produce. For this reason, the following embodiment of the invention for wavelengths ≧250 nm is particularly preferred: a grayscale map is calculated with the aid of a control unit, preferably a computer, from the position-dependent value of the parameter measured in step a). The algorithm described above can be used for this purpose. The exposure of the semiconductor wafer in step b) is carried out by a projection apparatus which projects an image of said grayscale map onto the surface of the semiconductor wafer. In this case, the exposure apparatus is a projection apparatus which can project the image of the grayscale map directly onto the semiconductor wafer, without the use of a fixed filter or mirror. The projection apparatus preferably operates according to the principle of a data or video projector (a so-called "beamer"). In this case, the light from the projection lamp is deflected by means of a drivable mirror chip (a matrix of many hundreds of thousands of microscopically small mirrors on a chip having a size of a few cm²). A projection apparatus of this type, as is commercially available at the present time, makes it possible, for example, to control the light transmissivity in a range of from 0 to 100% with a resolution of 1024×768 pixels. This results in a density of approximately 6.5 points/mm² on the surface of a semiconductor wafer to be treated having a diameter of 300 mm.

For shorter wavelengths, in particular for wavelengths below 250 nm, it is increasingly difficult to find a suitable material for mirrors. In this case, it is particularly advantageous to produce the local differences in the light intensity by means of an array of a multiplicity of light sources arranged alongside one another, the light sources irradiating the semiconductor wafer directly or through an additional filter. The light sources are controlled individually or in groups in such a way that the light intensity acting at each position on the surface of the semiconductor wafer is in a defined relationship with the position-dependent value of the parameter measured in step a). An array of light sources can also be used in the case of longer wavelengths, i.e. wavelengths starting from 250 nm.

In each of the embodiments mentioned, the light sources are to be chosen in such a way that the desired local difference in the oxidation rate is sufficient to enable a highly planar interface between semiconductor material and oxide. The oxidation rate is dependent on the temperature, the wavelength, the light intensity and on the type and the concentration of the oxidizing agent.

The oxidizing agent or the composition of the atmosphere is to be chosen in combination with the light wavelength range used and in a manner dependent on the semiconductor material in such a way that the oxidation rate exhibits a sufficiently great dependence on the light intensity and wavelength. Typical oxidation conditions for low temperatures (below 550° C.) are described by Kazor et al. (Applied Surface Science 54 (1992), pages 460-464) and Ishikawa et al. (Jpn. J. Appl. Phys. 30 (1991) L661). The dependence of the oxidation rate on the wavelength was described by Young et al. (Applied Physics Letters 50(2) (1987), page 12).

A suitable set of parameters for the oxidation treatment can be determined by means of preliminary experiments (Kazor et al., Applied Surface Science 54 (1992), pages 460-464; Boyd et al., Nuclear Instruments and Methods in Physics Research B 121 (1997), pages 349-356).

In the context of the method according to the invention, oxygen, for example, is suitable as oxidizing agent for the position-dependent oxidation of silicon. It is supplied to the oxidation chamber preferably at a flow rate of 100 to 1000 cm³/min, preferably 150 to 600 cm³/min. The preferred pressure range is dependent on the light wavelength. At a wavelength of 185 nm or more, it is possible to work under atmospheric pressure or reduced pressure. At lower wavelengths, a reduced pressure, preferably of less than 100 hPa, is preferred owing to the increased absorption by the oxygen. The lifetime of the ozone formed from the oxygen molecules under UV irradiation is longer at reduced pressure; on the other hand, the dependence of the ozone concentration on position is better defined at atmospheric pressure on account of the shorter lifetime. The actual conditions should therefore be adapted to the objective.

Depending on the other parameters of the oxidation treatment, the intensity of the light radiated in is chosen such that the desired oxidation rate is achieved. A local intensity of 0 W/cm² to 10 W/cm² (in the case of lasers) is possible, 0 to 100 mW/cm² is preferred, and 0 to 30 mW/cm² is particularly preferred. A light source that is preferred for the oxidation of silicon is the low-pressure mercury lamp, which emits at wavelengths of 185 and 254 nm.

In order to obtain a sufficient oxidation rate, a temperature of 300 to 500° C. is preferred during the oxidation treatment. At these temperatures, oxidation rates of 2 to 6 nm per hour are possible depending on the light intensity. In order to achieve the oxide layer thicknesses that are usually required, a treatment duration of approximately 1 to 4 hours is required.

In order to increase the oxidation rate further, it is also possible to use higher temperatures in the range of 500° C. to 1100° C. (Oren et al., Journal of applied Physics 42(2) (1971), pages 752-756; Young et al., Applied Physics Letters, 50(2) (1987), page 80).

Flow inhomogeneities of the oxidizing agent which possibly occur, and which may lead to a deviating material removal at the edge of the semiconductor wafer, can be compensated for by means of a corresponding correction of the local light intensity.

The oxide layer is subsequently removed in step c). The oxide layer is preferably removed completely in step c). This is preferably done by means of a suitable etching method. The etching method may be a vapor phase etching method, a wet-chemical etching method or a plasma etching method. The conditions are preferably chosen in such a way that the etching method attacks only the oxide, but not the semiconductor material itself. If the semiconductor material is silicon, this can be achieved by using an aqueous solution containing hydrogen fluoride (HF). In the absence of oxidizing agents, hydrogen fluoride attacks only silicon oxide, but not silicon.

Since the oxidation and the removal of the oxide layer in each case proceed over the entire surface, a time-intensive scanning of the surface can be avoided. The method according to the invention can therefore be carried out in a cost-effective manner. Since the gradation and spatial resolution of the position-dependent light intensity can be selected very finely, the overlap effects which occur during scanning in accordance with the prior art can be avoided.

The method has the advantage that it has a locally correcting action up to the edge of the semiconductor wafer, so that the required quality is achieved up to the wafer edge. In particular, it is possible to achieve the required flatness or layer thickness with an edge exclusion of 2 mm or less, including the partial sites.

The method is suitable both for removing inhomogeneities in the semiconductor layer of an SOI wafer and for removing inhomogeneities in a semiconductor wafer, including edge roll off. Therefore, the semiconductor wafers which have been treated with the aid of the method according to the invention are also eminently suitable for connecting (bonding) to a further semiconductor wafer, since the bonding quality, in particular at the edge, is influenced by the SFQR values and by the edge roll off. Major economic advantages reside in the higher availability of the wafer surface for the production of components. This has a particularly pronounced effect in the case of SOI wafers, on account of the significantly higher production costs.

In the case of an SOI wafer, the method according to the invention is generally carried out only on the front side, i.e. the side which carries the semiconductor layer, and in the case of a semiconductor wafer without a layer structure, the method according to the invention is preferably carried out on the front side as well. If the edge roll off is also to be reduced on the rear side, the method also has to be applied to the rear side. In this case, the method can be applied to the front side and rear side sequentially or to both sides simultaneously.

It is preferable for no polishing to be carried out after the method according to the invention, in order not to degrade the flatness or layer thickness homogeneity again. Particularly in the case of SOI wafers having silicon layer thicknesses of less than 1 µm, no polishing should be carried out. If subsequent polishing is required for reducing the surface roughness, it should be associated with a smallest possible removal by polishing, in order to retain the flatness of the surface or the homogeneity of the layer thickness.

In the case of an SOI wafer which has been produced by transferring a semiconductor layer from a donor wafer to a base wafer, the method is carried out after the wafers have been joined and the layer has been separated from the remainder of the donor wafer. In the case of an SOI wafer, the method according to the invention can be combined with one or more thermal processes for smoothing the surface or for reinforcing the bonding force and/or with one or more oxidation treatments for thinning the semiconductor layer.

The method according to the invention allows the production of semiconductor wafers with an outstandingly flat surface and of SOI wafers with an outstanding layer thickness homogeneity.

In particular, the method according to the invention permits the production of semiconductor wafers, the front sides of which have a GBIR of at most 0.09 µm, an $SFQR_{max}$ in a measurement window with a size of 26×8 mm$^2$ including partial sites of at most 0.05 µm with an edge exclusion of 2 mm, and an edge roll off on the front side of at most 0.2 µm, measured in a region between 1 mm and 3 mm away from the edge of the semiconductor wafer. Preferably, the semiconductor wafers produced according to the invention are distinguished by an $SFQR_{max}$ in a measurement window of a size of 26×8 mm$^2$ including partial sites of at most 0.03 µm with an edge exclusion of 2 mm. The invention also allows the production of semiconductor wafers, the front sides of which have a nanotopography (peak to valley) in a measurement window of a size of 2×2 mm$^2$ of at most 16 nm with an edge exclusion of 2 mm. Since these flatness parameters may be achieved without polishing afterwards, the surface quality is different from polished wafers, even were a polished wafer having such flatness parameters capable of being fabricated.

Very flat semiconductor wafers produced according to the invention, in particular composed of single-crystal silicon, are suitable for use in the semiconductor industry, in particular for the fabrication of electronic components with line widths of 65 nm or less. They are also particularly well suited as donor wafers or base wafers for the production of bonded SOI wafers, in particular since the flatness including edge roll off is ensured even with a very small edge exclusion of just 2 mm.

The invention also allows the production of SOI wafers, comprising a semiconductor layer and a base wafer, the semiconductor layer being less than 100 nm thick and the relative standard deviation from the mean thickness of the semiconductor layer being at most 3% with an edge exclusion of 2 mm. The relative standard deviation in the thickness of the semiconductor layer is also referred to below as the layer thickness homogeneity. The SOI wafers produced according to the invention, given a layer thickness of at most 100 nm, are preferably distinguished by a layer thickness homogeneity of at most 1% with an edge exclusion of 2 mm.

It is particularly preferred for the inventive method firstly to be applied to the donor wafer and the base wafer before these wafers are connected to one another, then for the base wafer with the semiconductor layer to be separated from the remainder of the donor wafer, and thereafter for the SOI wafer which has been produced in this way to be subjected to the inventive method once again, in order to homogenize the thickness of the semiconductor layer. An SOI wafer produced in this way, in addition to the properties mentioned above, is distinguished by a GBIR of at most 0.1 µm and an $SFQR_{max}$ in a measurement window of a size of 26×8 mm$^2$ including partial sites of at most 53 nm with an edge exclusion of 2 mm, and an edge roll off on the front side of at most 0.25 µm, measured in a region between 1 mm and 3 mm away from the edge of the semiconductor wafer.

Since the method according to the invention can also be applied to SOI wafers with a thick semiconductor layer, it also permits the production of SOI wafers, comprising a semiconductor layer and a base wafer, the semiconductor layer having a thickness in the range from 0.1 µm to 80 µm, and the relative standard deviation from the mean thickness of the semiconductor layer amounting to at most 4% with an edge exclusion of 2 mm. The SOI wafer with thick semiconductor layer produced according to the invention is preferably distinguished by a layer thickness homogeneity of at most 2% with an edge exclusion of 2 mm.

If the SOI wafer is produced by applying the method to the donor wafer and the base wafer and then to the SOI wafer as described above for SOI wafers with a thin semiconductor layer, which is preferred, then the SOI wafer with thick semiconductor layer is additionally distinguished by a GBIR of at most 0.11 µm and an $SFQR_{max}$ in a measurement window of a size of 26×8 mm$^2$ including partial sites, of at most 55 nm with an edge exclusion of 2 mm and an edge roll off on the front side of at most 0.3 µm, measured in a region between 1 mm and 3 mm away from the edge of the SOI wafer.

Moreover, an SOI wafer with thick or thin semiconductor layer produced according to the invention preferably has a nanotopography (peak to valley) in a measurement window of a size of 2×2 mm$^2$ of at most 16 nm, preferably of at most 8 nm and most preferably of at most 2 nm, with an edge exclusion of 2 mm.

Preferred embodiments of the method according to the invention are described below, which embodiments can be used to increase the material removal of the method. In the case of SOI wafers; for example, it may be desirable not just to improve the homogeneity of the layer thickness but to reduce the layer thickness toward a defined target value by means of the method according to the invention. In the context of the method according to the invention, this can be achieved by means of a uniform, position-independent increase in the material removal obtained in steps b) and c). There are a number of possibilities for this.

One possibility involves, in addition to step b), a further oxidation treatment with a homogeneous, non-position-dependent oxidation rate. This further oxidation treatment can be carried out before step b), between steps b) and c), or after step c). In the first case, it is possible to remove the oxide layer with homogeneous thickness analogously to step c) before the position-dependent oxidation is begun in step b). In the second case, the entire oxide layer produced is removed in step c). The third case involves subsequently removing the additional oxide layer with homogeneous thickness analogously to step c). These steps can also be repeated a number of times. The additional oxidation treatment can be carried out for increasing the oxidation rate for example with full exposure of the semiconductor wafer. However, the oxidation rate can also be increased by supplying externally produced ozone into the oxidation chamber. The generation of a plasma also increases the oxidation rate.

The combination of homogenization and thinning may, however, also be carried out solely by means of steps b) and c). In this case, the total amount of material which is required to be removed to reach the desired final thickness is taken into account in the calculation of the locally different light intensity. In step b), the oxidation rate can be increased homogeneously, that is to say independently of the position, by means of generally increasing the light intensity, increasing the temperature, by simultaneously supplying externally produced ozone or by plasma assistance. The required dependence of the oxidation rate on position is achieved by means of the position-dependent exposure effected in the oxidation chamber.

An apparatus that is particularly well suited to carrying out the method according to the invention is described below with reference to figures. In one embodiment, an apparatus for the treatment of a semiconductor wafer 5, comprises:

a measuring apparatus 11 for the position-dependent measurement of a parameter which characterizes the semiconductor wafer 5, an oxidation chamber 6 for receiving the semiconductor wafer 5, comprising a holding apparatus for the semiconductor wafer 5 and a system 9 for supplying and discharging the oxidizing agent, an exposure apparatus, which comprises a multiplicity of light sources 2 arranged alongside one another in a plane lying parallel to the plane of the semiconductor wafer 5, the light sources 2 being able to be controlled individually or in groups, and which is arranged in such a way that it can expose one side of the semiconductor wafer 5 situated in the oxidation chamber 6 with a position-dependent light intensity, and a control unit 10 for converting the values of the parameter determined by the measuring apparatus 11 into instructions for controlling the exposure apparatus and forwarding the instructions to the exposure apparatus.

The controllable exposure apparatus comprises a multiplicity of light sources 2. These individual light sources are arranged alongside one another in a plane lying parallel to the plane of the semiconductor wafer 5 and can be controlled individually or in groups in such a way that they can expose one side of the semiconductor wafer 5 situated in the oxidation chamber 6 with a position-dependent light intensity. The individual light sources may have various forms, for example ring-shaped, circular, square or strip-shaped. The light sources may have the same form or different forms. The individual light sources 2 emit light with a defined power and wavelength.

Low-pressure mercury lamps, for example, which emit light having wavelengths of 185 and 254 nm, may be used as light sources 2 for this exposure apparatus. The position-dependent light intensity on the surface of the semiconductor wafer 5 preferably lies within the range of 0 to 30 mW/cm$^2$.

Figure 1:
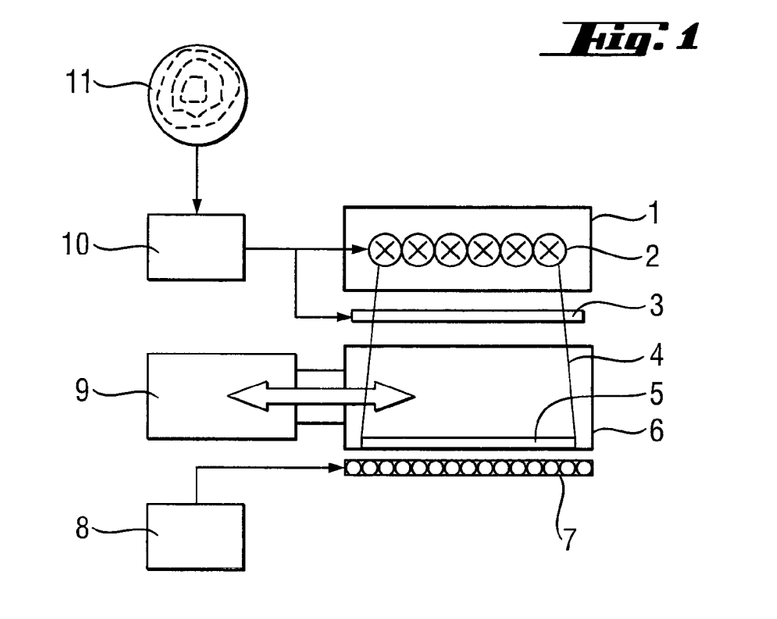
FIG. 1 schematically shows the construction of an apparatus according to the invention with a multiplicity of individual light sources.

The light sources 2 may be fitted either directly in the oxidation chamber 6 (see FIG. 2) or in a dedicated housing 1 outside the oxidation chamber 6 (see FIG. 1).

A filter 3 may be arranged between the light sources 2 and the semiconductor wafer 5. The wavelength range of the light can be filtered by said filter. However, it is also possible to use a filter which allows the setting of a transmission that varies in position-dependent fashion, for example an LCD filter. It is also possible to use both types of filters in combination. In the case illustrated in FIG. 2, the filter is also situated in the oxidation chamber 6.

Figure 2:
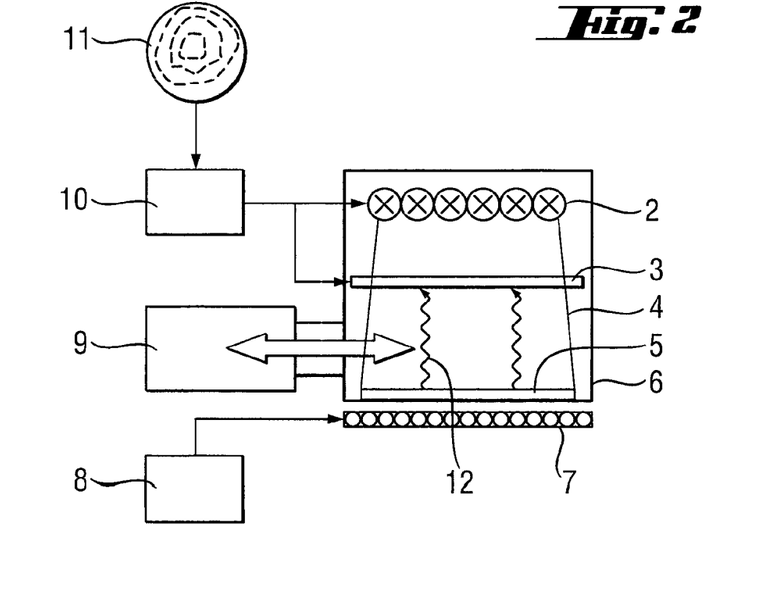
FIG. 2 schematically shows the construction of a further apparatus according to the invention with a multiplicity of individual light sources.

In the apparatus illustrated in FIG. 2, the filter protects the light sources 2, which are likewise situated in the oxidation chamber, against overheating by the thermal radiation emitted by the semiconductor wafer. In the arrangement illustrated in FIG. 1, an overheating of the light sources 2 can also be avoided by means of a suitable choice of material for the upper part of the oxidation chamber 6 facing the light sources. By way of example, it is possible to use a glass which is transparent to the radiation 4 (preferably UV radiation) emitted by the light sources and simultaneously absorbs the IR radiation 12 emitted by the semiconductor wafer. Overheating of the light sources 2 can also be avoided by a cooling of the light sources, for example by means of air or water.

The intensity of the light at the surface of the semiconductor wafer 5 depends on the aperture angle of the light sources 2, on the distance between the light sources 2 and the semiconductor wafer 5, and also on the electrical voltage applied to the light source. The direction of propagation of the light emitted by the light sources 2 should be essentially perpendicular to the surface of the semiconductor wafer 5. In order to ensure a sufficient spatial resolution, the individual light sources 2 of the exposure apparatus preferably have a smallest possible aperture angle, particularly when there is a relatively large distance between light sources 2 and semiconductor wafer 5. The overlap of the light cones of the individual light sources 2 on the semiconductor wafer 5 should preferably be restricted to the respective directly adjacent light sources. In order to achieve this, it is possible to use suitable lenses, reflectors or diaphragms. These additional optical components can be used for each light source individually or for groups of light sources. Typically, the aperture angle is between 0° and 10° and the distance between the light sources and the semiconductor wafer is between 1 and 50 cm.

The light intensity emitted by an individual light source 2 can be controlled by means of the electrical voltage applied to the light source. Depending on the geometrical boundary conditions such as the distance between light sources and semiconductor wafer or the aperture angle of the light sources, the light intensity required at a specific position on the surface of the semiconductor wafer is controlled by means of the voltage applied to an individual light source 2. The individual control of each individual light source is preferred in order to achieve a highest possible resolution (sharpness) during the irradiation. However, it is also possible for groups of individual light sources to be controlled jointly.

In the case of using the apparatuses which are illustrated schematically in FIGS. 1 and 2, the grayscale matrix that was calculated on the basis of the measured values obtained in step a) of the method corresponds to the matrix of the powers of the individual light sources. When there is a small overlap of the light cones, the power of the individual light source is proportional to the transparent component of the corresponding point in the grayscale matrix.

The control unit 10 can control further functions of the apparatus besides the exposure device 1 and, if appropriate, a controllable filter 3 (for example LCD filter), such as, for example, the loading and unloading of semiconductor wafers by means of a robot or the parameters for the oxidation treatment, such as, for example, temperature (e.g. by means of the heating 7), duration of the oxidation treatment and flow rate of the oxidizing agent through the system 9 for supplying the oxidizing agent.

The oxidation chamber 6 which is used for the oxidation treatment can receive the semiconductor wafer 5 either lying horizontally or standing vertically. In order to achieve a homogeneous oxidation rate (apart from the locally different light intensity), the semiconductor wafer 5 can be moved. By way of example, it is possible to rotate the semiconductor wafer 5, but this has to be simultaneously complemented by the exposure apparatus 1 and, if appropriate, by the filter 3, for example by simultaneous rotation. However, it is preferred for the semiconductor wafer 5 not to be moved.

Furthermore, it is possible to use cooling to homogenize the temperature. Since the oxidation treatment is generally carried out at elevated temperatures, however, a heating 7 is preferred, which is controlled either by means of a separate controller 8 or by means of the control unit 10.

A system 9 for supplying the oxidizing agent, which delivers the oxidizing agent in the required quantity, metering and quality (if appropriate filtration), is connected to the oxidation chamber 6.

An in-situ measurement of the thickness of the oxide layer is possible by the use of an integrated measuring system 11, in which case the present measurement data can immediately be forwarded to the control unit 10 and processed.

EXAMPLE

An SOI wafer having a diameter of 300 mm, produced by transferring a silicon layer from a donor wafer to a base wafer, is treated. The thickness of the wafer is 735 µm, the thickness of the silicon oxide layer is 80 nm, and the target thickness of the silicon layer situated on the silicon oxide layer is 20 nm.

Figure 3:
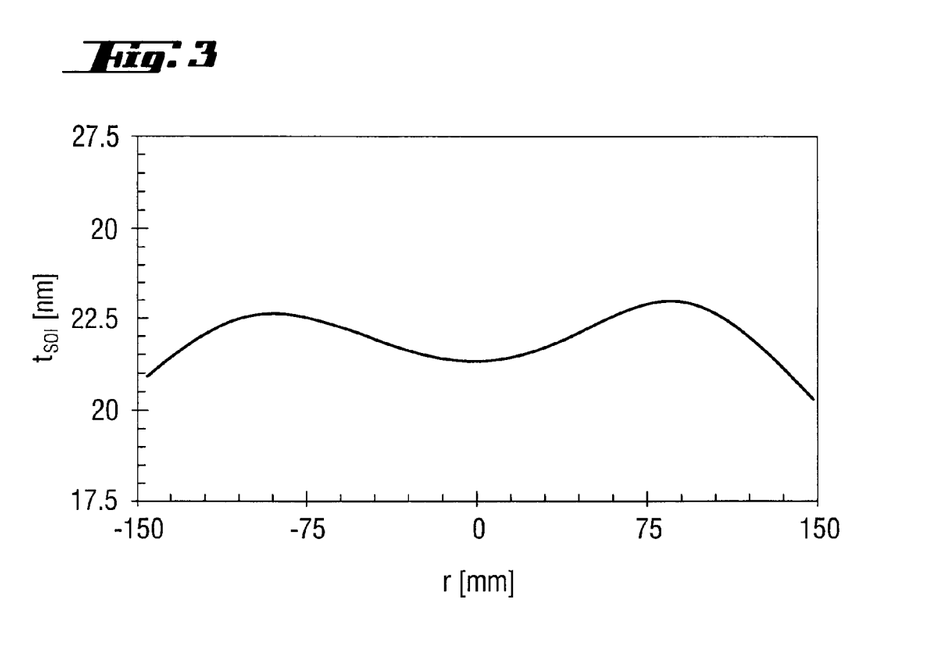
FIG. 3 shows a radial thickness profile of the silicon layer of an SOI wafer produced in accordance with the prior art.

In step a), the thickness of the silicon layer is measured exactly in a position-dependent manner by means of an interferometer. The measurement with 2000 measurement points and an edge exclusion of 1 mm gives a mean layer thickness of 21.9 nm with a standard deviation of 0.7 nm and a difference of 2.8 nm between maximum and minimum layer thickness. FIG. 3 represents a thickness profile along a diameter, i.e. the thickness $t_{SOI}$ of the silicon layer, measured in the unit nm, as a function of the radial position r, measured in the unit mm. The thickness measured values are stored in a computer and converted into a grayscale map. Positions with a greater layer thickness in this case give a higher transparent component on the grayscale map, so that higher exposure takes place at these positions, and therefore a higher removal rate is achieved, and vice versa.

The oxidation treatment is subsequently carried out in step b). The SOI wafer freshly cleaned by the RCA method is introduced into the oxidation chamber and heated under nitrogen to the process temperature of 500° C. When the process temperature is reached, the process is started by switching to oxygen with a flow rate of 0.5 l/min at atmospheric pressure and switching on the whole-area UV illumination with a locally different intensity. An array of low-pressure mercury lamps is used as exposure apparatus, the emitted wavelength at 185 nm being used. The distance between the light sources and the surface of the silicon layer is 10 cm. The grayscale map calculated previously in step a) is then imaged onto the surface of the silicon layer by means of the light source array, the lamps being driven individually according to the grayscale map. In this way, the surface of the silicon layer is irradiated with locally different light intensity. The light intensity at the surface of the silicon layer varies in position-dependent fashion between 1 and 30 mW/cm². After an oxidation time of 60 min, an oxide layer thickness of 6.0 nm (corresponding to 2.88 nm oxidized silicon) results at the thickest position and an oxide layer thickness of 1.8 nm (corresponding to 0.86 nm oxidized silicon) results at the thinnest position. After the end of the oxidation time, the oxidation chamber is purged with nitrogen and the wafer is removed from the oxidation chamber. The oxide layer is subsequently removed completely by means of wet-chemical etching. This is done using an aqueous solution, which contains 0.5% hydrogen fluoride (HF) and is buffered with 20% ammonium fluoride ($NH_3F$). The treatment with this solution does not lead to a measurable roughening of the surface of the silicon layer.

Figure 4:
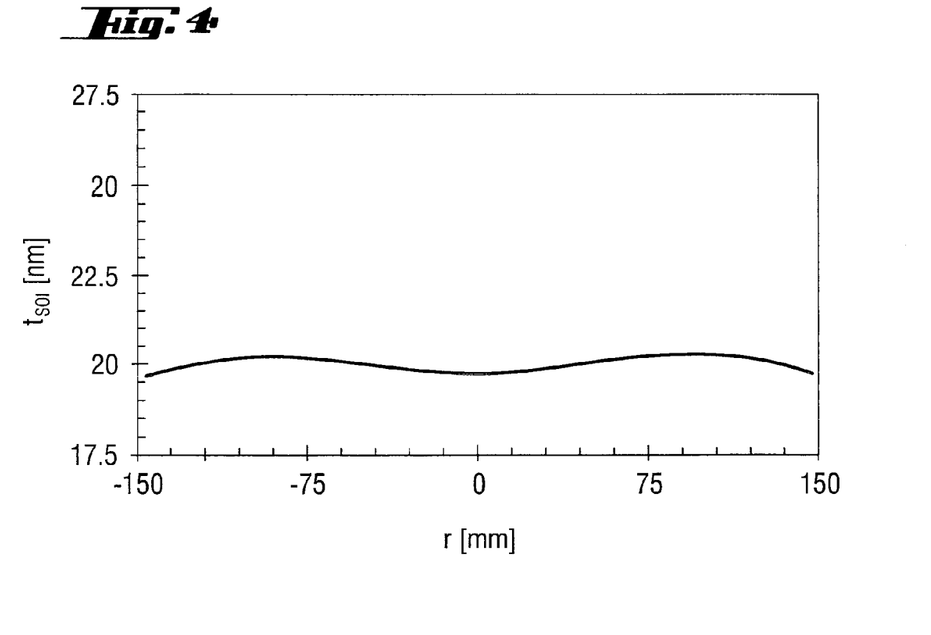
FIG. 4 shows the radial thickness profile of the silicon layer of an SOI wafer after it has been subjected to the method according to the invention.

The position-dependent thickness of the silicon layer is then measured again using the same thickness measuring method as at the beginning. The mean layer thickness is now 20.1 nm with a standard deviation of 0.21 nm and a difference of 0.65 nm between the maximum and minimum layer thickness. The thickness profile along the diameter, FIG. 4, shows the clear leveling of the silicon layer.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the treatment of a semiconductor wafer, comprising the following steps:
  a) position-dependent measuring of a parameter which characterizes the semiconductor wafer in order to determine the position-dependent value of the parameter over an entire surface of the semiconductor wafer,
  b) oxidizing the surface of the semiconductor wafer with an oxidizing agent which contacts the surface of the wafer, while simultaneously exposing the entire surface by light of a variable light intensity, the oxidation rate and the thickness of the resulting oxide layer thus being varied by the light intensity at the surface of the semiconductor wafer, and
  c) removing the oxide layer,
the light intensity in step b) being predefined in a position-dependent manner such that over the wafer surface, the differences of the position-dependent values of the parameter measured in step a) are reduced by the position-dependent oxidation rate resulting from the position-dependent light intensity in step b) and the subsequent removal of the oxide layer in step c).

2. The method of claim 1, wherein the semiconductor wafer comprises silicon-germanium or silicon carbide.

3. The method of claim 1, wherein the exposure of the semiconductor wafer is effected by a light source and a filter fitted between the light source and the semiconductor wafer, the filter having a position-dependent light transmissivity which is in a defined relationship with the position-dependent value of the parameter.

4. The method of claim 1, wherein a grayscale map is calculated with the aid of a computer from the position-dependent value of the parameter measured in step a), and the exposure of the semiconductor wafer in step b) is effected by a projection apparatus which projects an image of said grayscale map onto the surface of the semiconductor wafer.

5. The method of claim 1, wherein the exposure of the semiconductor wafer is effected by a multiplicity of light sources which are arranged alongside one another in a plane lying parallel to the plane of the semiconductor wafer, the light sources being controlled individually or in groups in such a way that the light intensity acting on the surface of the semiconductor wafer at each position is in a defined relationship with the position-dependent value of the parameter.

6. The method of claim 1, wherein the oxidizing agent is gaseous.

7. The method of claim 6, wherein the oxidizing agent is oxygen, ozone, a nitrogen oxide, or combination thereof.

8. The method of claim 7, wherein the semiconductor wafer comprises silicon.

9. The of claim 1, wherein a parameter measured is the height deviation from a defined ideal plane.

10. The method of claim 1, wherein the semiconductor wafer is an SOI wafer which comprises a semiconductor layer on an electrically insulating carrier.

11. The method of claim 10, wherein the semiconductor layer comprises silicon-germanium or silicon carbide.

12. The method of claim 10, wherein the semiconductor layer comprises silicon.

13. The method of claim 10, wherein the parameter measured is the thickness of the semiconductor layer.

* * * * *

UNITED STATES PATENT AND TRADEMARK OFFICE
CERTIFICATE OF CORRECTION

PATENT NO. : 7,799,692 B2  Page 1 of 1
APPLICATION NO. : 11/749938
DATED : September 21, 2010
INVENTOR(S) : Brian Murphy et al.

It is certified that error appears in the above-identified patent and that said Letters Patent is hereby corrected as shown below:

Column 17, Line 5, Claim 9:

After "The" insert -- method --.

Signed and Sealed this

Seventh Day of December, 2010

David J. Kappos
*Director of the United States Patent and Trademark Office*